United States Patent [19]

Piorunneck et al.

[11] Patent Number: 5,380,213

[45] Date of Patent: Jan. 10, 1995

[54] ELECTRICAL CONNECTOR WITH IMPROVED EJECTORS AND ASSEMBLY

[75] Inventors: Heinz Piorunneck, Trumbull; Rocco J. Noschese, Wilton, both of Conn.

[73] Assignee: Burndy Corporation, Norwalk, Conn.

[21] Appl. No.: 67,729

[22] Filed: May 21, 1993

[51] Int. Cl.[6] .................................. H01R 13/62
[52] U.S. Cl. ................................. 439/160; 439/70
[58] Field of Search .................. 439/70, 152-160, 439/372, 351, 352, 357, 358, 680, 681; 361/392, 395

[56] References Cited

U.S. PATENT DOCUMENTS

| | | | |
|---|---|---|---|
| 3,784,954 | 1/1974 | Grimm et al. | 339/17 IM |
| 4,193,655 | 3/1980 | Herrmann, Jr. | 439/680 |
| 4,241,966 | 12/1980 | Gomez | 439/157 |
| 4,345,267 | 8/1982 | Corman et al. | 357/81 |
| 4,364,626 | 12/1982 | Price | 439/680 |
| 4,579,408 | 4/1986 | Sasaki | 339/45 M |
| 4,587,595 | 5/1986 | Staples | 361/388 |
| 4,712,159 | 12/1987 | Clemens | 361/386 |
| 4,898,540 | 2/1990 | Saito | 439/153 |
| 4,973,255 | 11/1990 | Rudoy | 439/157 |
| 5,000,692 | 3/1991 | Taniguchi et al. | 439/160 |
| 5,057,029 | 10/1991 | Noorily | 439/160 |
| 5,073,116 | 12/1991 | Beck, Jr. | 439/71 |
| 5,108,298 | 4/1992 | Simmel | 439/157 |
| 5,167,517 | 12/1992 | Long | 439/160 |

OTHER PUBLICATIONS

IBM Technical Disclosure Bulletin, vol. 23, No. 12, May 1981, "Spring Clip Mounted Extruded Aluminum Heat Sink", p. 5303.

*Primary Examiner*—David L. Pirlot
*Attorney, Agent, or Firm*—Perman & Green

[57] ABSTRACT

An electrical connector is provided with a housing, electrical contacts mounted to the housing, and ejectors pivotally mounted to the housing. The ejectors have pivot posts that extend in the same direction and spaced ejecting fingers. The pivot posts are axially slid into pivot holes at the edge of the housing along a first direction. The ejectors are then rotated in a second direction orthogonal to the first direction with the fingers being received in finger holes in the housing to thereby prevent the ejectors being inadvertently disconnected from the housing. The fingers and finger holes extend, at least partially, between adjacent contact receiving holes in the housing. Detent locating of the ejectors is provided at an open position and a closed position. The housing includes blocking projections to prevent connection of an integrated circuit chip other than in a predetermined position.

24 Claims, 6 Drawing Sheets

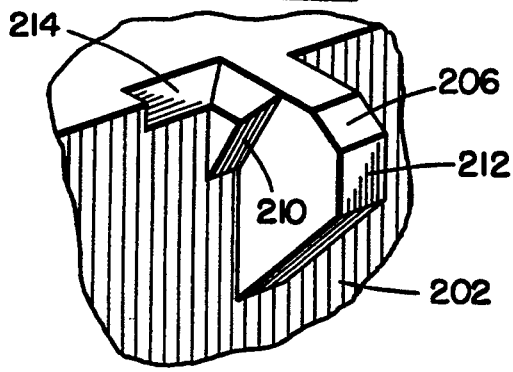
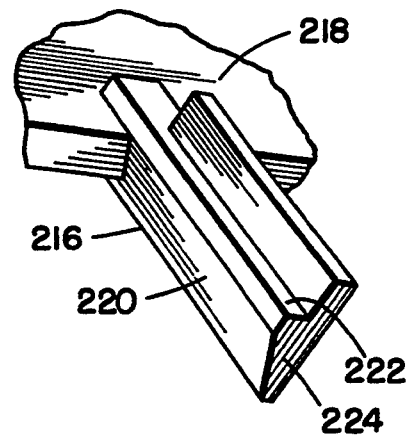
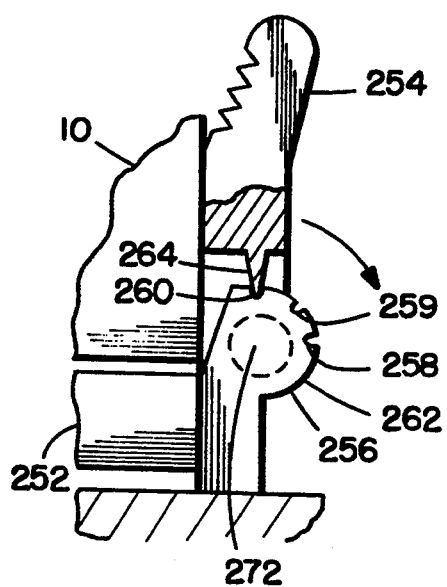
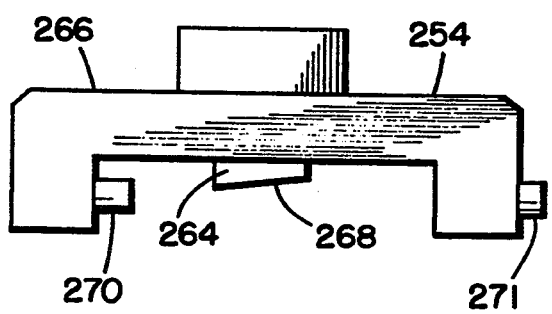
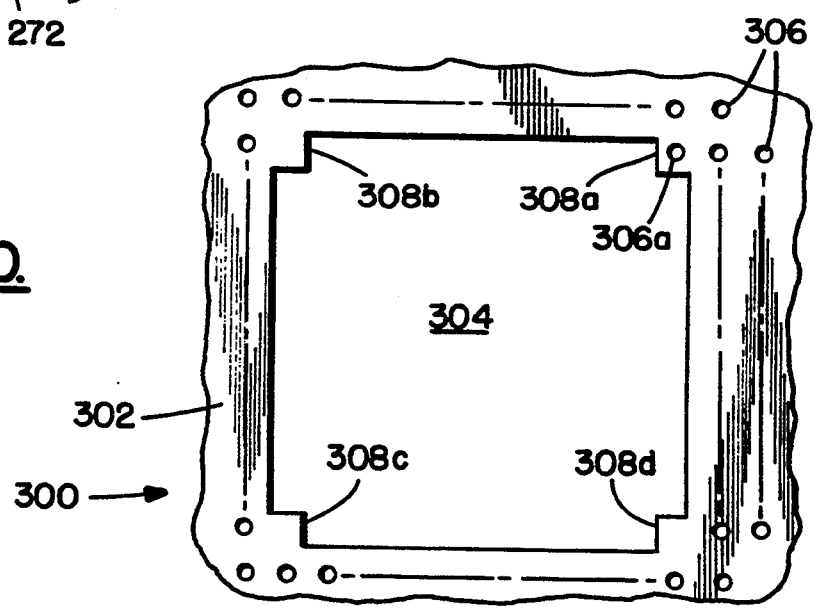

ELECTRICAL CONNECTOR WITH IMPROVED EJECTORS AND ASSEMBLY

BACKGROUND OF THE INVENTION

1. Field of the Invention

The present invention relates to electrical connectors and, more particularly, to an electrical connector having ejectors to eject or disconnect an electrical component from the connector.

2. Prior Art

U.S. Pat. No. 5,073,116 discloses a socket connector for an integrated circuit chip or module. U.S. Pat. Nos. 4,712,159; 4,345,267; and 4,587,595 disclose heat sinks for an integrated circuit or other electronic device package. U.S. Pat. No. 5,000,692 discloses electrical connector sockets for relays with release levers. U.S. Pat. Nos. 5,167,517; 5,108,298; 5,057,029; 4,973,255; 4,898,540; 4,579,408; 4,241,966; and 3,784,954 disclose other electrical connectors with ejectors.

SUMMARY OF THE INVENTION

In accordance with one embodiment of the present invention, an electrical connector is provided comprising a housing, electrical contacts, and an ejector pivotally mounted to the housing. The ejector has a first section that is laterally slid in a first direction into a first receiving portion of the housing and a second portion that is then rotated in a second direction, orthogonal to the first direction, into a second receiving portion of the housing. Interaction between the second section and the housing prevents the ejector from inadvertently laterally sliding out of the first receiving portion.

In accordance with another embodiment of the present invention an electrical connector is provided comprising a housing, electrical contacts, and ejectors. The housing has a top surface, contact receiving holes, and ejector receiving areas. The ejector receiving areas include spaced finger holes extending into the housing from the top surface. The finger holes extend, at least partially, between adjacent contact receiving holes. The ejectors are mounted to the housing at the ejector receiving areas and include fingers movably located in the finger holes between recessed positions and extended positions.

In accordance with another embodiment of the present invention, an electrical connector is provided comprising a housing, electrical contacts, ejectors, and means for detent locating the ejectors. The ejectors are pivotally connected to the housing. The ejectors each have two arms pivotally connected to the housing and an intermediate bridging section connecting the two arms to each other. The means for detent locating can locate the ejectors at a first open position and a second locking position wherein the ejectors are retained at the first position and the second position until moved by a user.

In accordance with another embodiment of the present invention an electrical connector adapted to removably connect an integrated circuit chip to a printed circuit board as provided. The electrical connector comprises a housing, electrical contacts, and means for preventing connection of the integrated circuit chip to the electrical contacts. The housing has a top surface with a center aperture extending through the housing from the top surface to a bottom surface. The housing further includes four projections extending into the center aperture from four corners of the center aperture and, contact receiving areas. The means for preventing connection can prevent connection unless the integrated circuit chip is located at a predetermined orientation relative to the housing. The means for preventing connection comprises only a first one of the four projections having a contact receiving area and the four projections being suitably positioned such that the projections will block a key pin on the integrated circuit chip, thereby blocking insertion of the chip, unless the keying pin is aligned over the first projection.

In accordance with one method of the present invention a method of connecting ejectors to a housing of an integrated circuit chip socket connector is provided comprising the steps of providing a housing of the socket connector with pivot sections at edges of the housing, the pivot sections each having a pivot hole with a center axis parallel to its associated edge; providing an ejector with two spaced arms, each arm having a pivot post extending in a first direction; inserting the pivot posts into two of the pivot holes in the first direction along one of the edges of the housing, the pivot posts axially sliding into the two pivot holes; and rotating the ejector in a second direction orthogonal to the first direction such that a portion of the ejector is rotated into a receiving cavity of the housing to block removal of the pivot posts from the pivot sections in a third direction reverse to the first direction.

BRIEF DESCRIPTION OF THE DRAWINGS

The foregoing aspects and other features of the invention are explained in the following description, taken in connection with the accompanying drawings, wherein:

FIG. 8B is an enlarged perspective of a detent lock on the housing of the electrical connector shown in FIG. 8A.

FIG. 8C is an enlarged perspective view of the detent post on the ejector shown in FIG. 8A.

FIG. 9A is a schematic sectional view of an end of an alternate embodiment of an electrical connector incorporating features of the present invention.

FIG. 9B is a rear view of the ejector shown in FIG. 9A.

FIG. 10 is a plan top view of a housing incorporating features of the present invention.

DETAILED DESCRIPTION OF THE INVENTION

Figure 1:
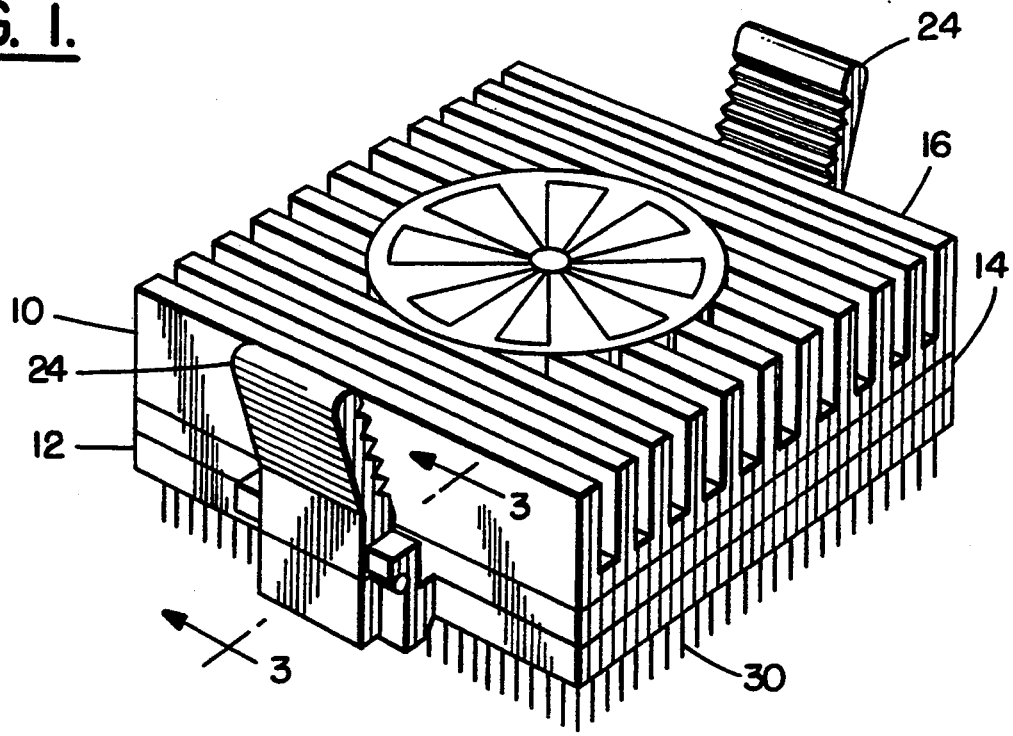
FIG. 1 is a perspective view of an electrical connector incorporating features of the present invention having an integrated circuit chip connected thereto.

Referring to FIG. 1, there is shown a perspective view of an integrated circuit chip module 10 connected to an electrical connector 12 incorporating features of the present invention. Although the present invention will be described with reference to the various embodiments shown in the drawings, it should be understood that features of the present invention can be incorporated into various different forms of embodiments. In addition, any suitable size, shape or type of elements or materials could be used.

Figure 2:
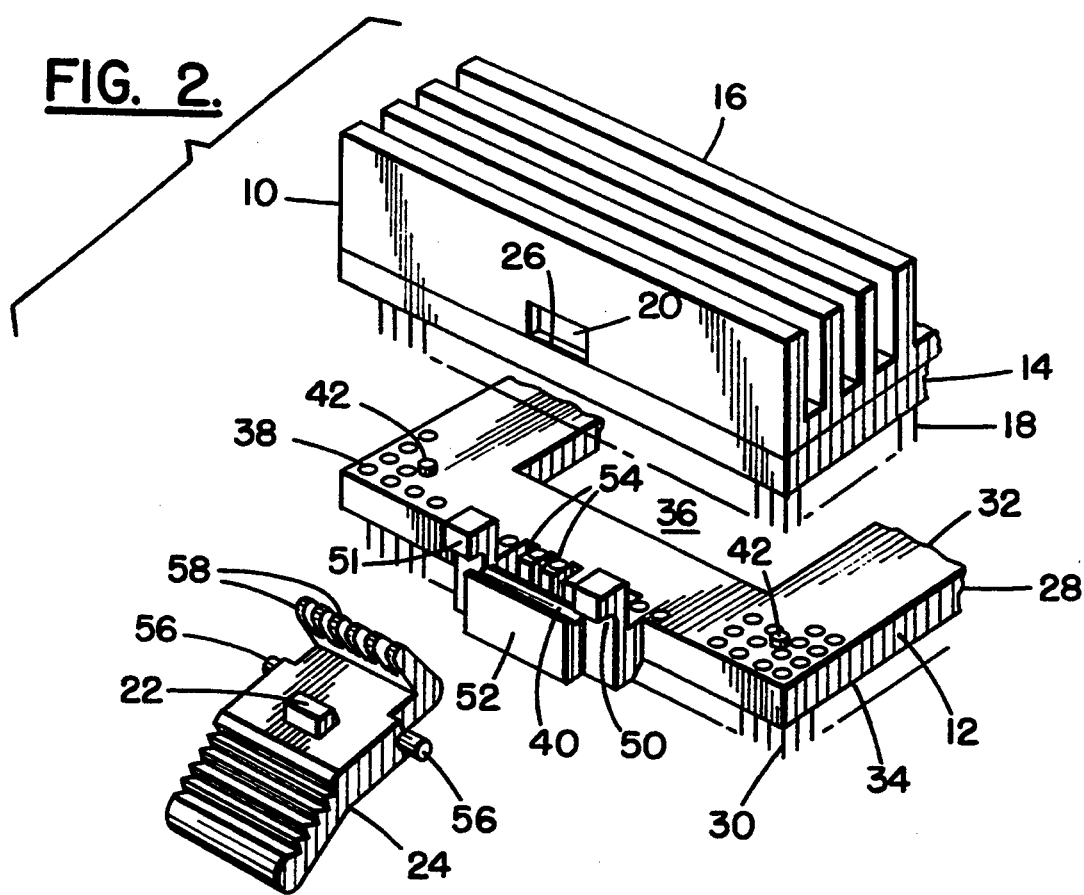
FIG. 2 is a partial exploded view of the electrical connector and integrated circuit chip shown in FIG. 1.
Figure 3:
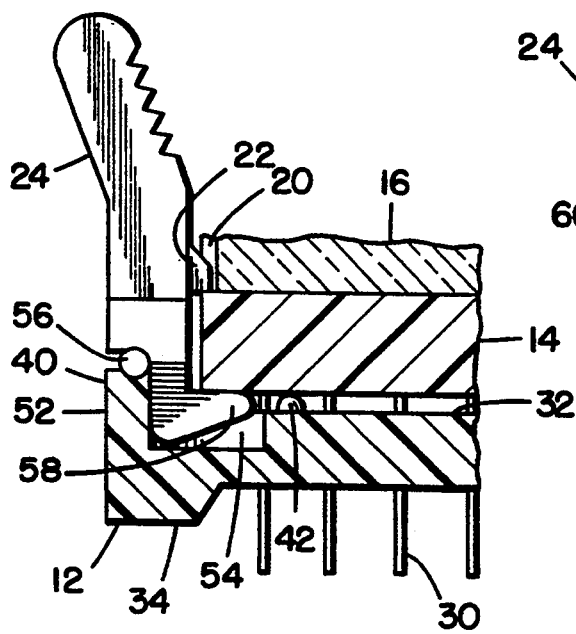
FIG. 3 is a schematic partial cross sectional view of the assembly shown in FIG. 1 taken along line 3—3.
Figure 4:
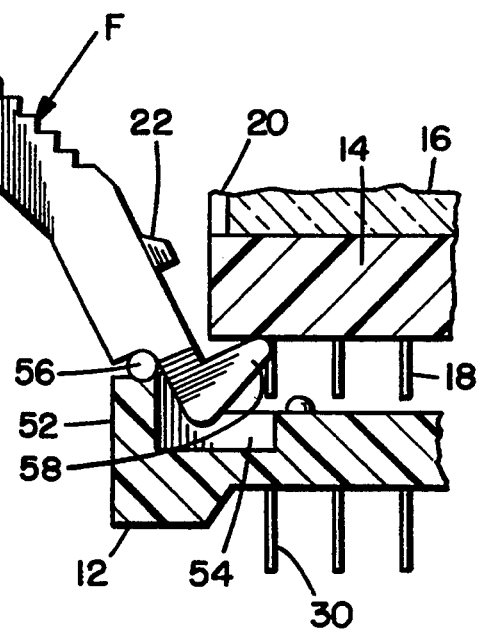
FIG. 4 is a schematic cross sectional view as in FIG. 3 showing the ejector being moved to an open ejection position and the subsequent movement of the integrated circuit chip.

Referring also to FIGS. 2–4, the integrated circuit chip module 10 generally comprises an integrated circuit chip 14 and a heat sink 16. The chip 14 is preferably a microprocessor such as the PENTIUM chip sold by Intel Corp. PENTIUM is a trademark of Intel Corp. The PENTIUM chip has 273 male contact pins 18 that extend from its bottom in a general square ring shape with one keying pin at an internal corner inside and slightly offset from the rest of the ring. Of course, in alternate embodiments, the connector 12 could be adapted or modified to be used with any suitable type of electrical or electronic component including chips with more than 273 male contact pins or other than with a general square ring shaped pattern of male pins. The heat sink 16 is preferably made of a non-conductive ceramic material and is fixedly attached to the chip 14, such as by a fastening clip. However, in an alternate embodiment, the chip 14 could be attached to the connector 12 without the heat sink 16 or, the heat sink 16 could be added to the chip 14 after it is connected to the connector 12. In the embodiment shown, the heat sink 16 covers substantially the entire top surface of the chip 14. However, two ends of the heat sink 16 have recesses 20 (only one of which is shown) that allow a hold down lock 22 on ejectors 24 to contact the top surface 26 of the chip 14.

The electrical connector 12 generally comprises a housing 28, electrical contacts 30, and the ejectors 24. The housing 28 is comprised of a dielectric material such as molded plastic or polymer. The housing 28 has a general square ring shaped profile with a top surface 32, a bottom surface 34, a center aperture 36, contact receiving holes 38, and ejector receiving areas 40 at opposite ends of the housing (only one of which is shown). The top surface 32 includes standoffs 42 that are adapted to be contacted by the bottom of the chip 14 to thereby position the chip 14 at a predetermined location above the top surface 32, such as about 0.02 inch.

Figure 3A:
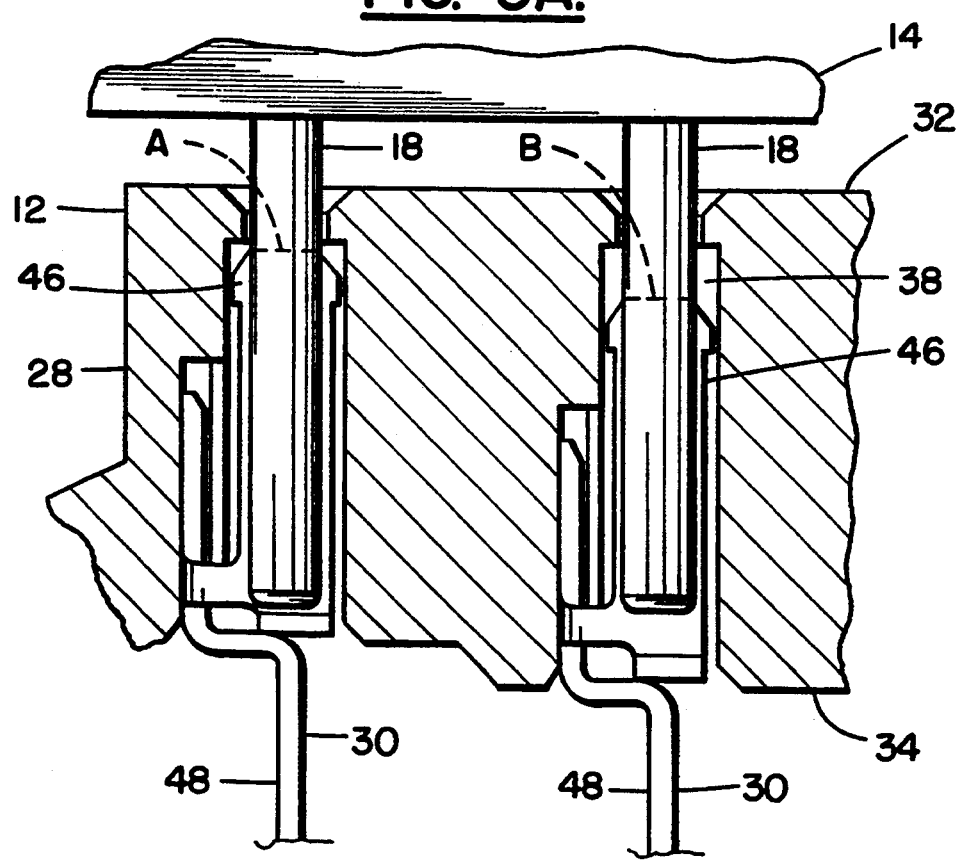
FIG. 3A is an enlarged cross sectional view of the connection between the integrated circuit chip and the electrical connector made inside the electrical connector.

However, the standoffs need not be provided. Referring also to FIG. 3A, the contact receiving holes 38 extend through the housing 28 from the top surface 32 to the bottom surface 34. The electrical contacts 30 are located in two levels in the receiving holes 38 such that two different high points of contact A and B are provided. During insertion of the male pins 18 into the electrical contact 30 the different levels allow a stepped insertion force that reduces the overall insertion force required to connect the 273 pins 18 to the 273 electrical contacts 30. However, in alternate embodiments this stepped insertion force distribution need not be provided or, any suitable type of insertion force distribution could be provided. The electrical contacts 30 are fixedly mounted in the holes 38 with female contact receiving sections 46 inside the holes 38 and printed circuit board contact sections 48, such as through-hole male contact sections, extending out of the bottom of the housing 28.

The ejector receiving areas 40 are identical to each other and located on opposite sides of the housing 28. The areas 40 each comprise two pivot sections 50, 51 on opposite sides of a center section 52, and finger holes 54, the pivot sections 50, 51 and center section 52 are suitably sized and shaped to allow pivot posts 56 of the ejector 24 to be snap-lock mounted in the area 40 for pivotal movement about the common center axis of the pivot posts 56. The ejector 24 includes ejection fingers 58 that are suitably sized, shaped and spaced to be movably received in the housing finger holes 54. The housing finger holes 54 extend between adjacent contact holes 38 at the edge of the housing 28. The fingers 58 are thus positioned, at least partially, between the adjacent contact holes 38 at the edge of the area 40. FIG. 3 shows the ejector 24 in a closed position. The hold down lock 22 is located in the recess 20 to prevent the module 10 from becoming inadvertently disconnected from the connector 12, such as due to vibrations. The top surface of the fingers 58 assist the standoffs 42 in keeping the bottom of the module 10 off of the top surface 32 of the connector housing. Upon applying a force F to the thumb section 60 of the ejector 24, as shown in FIG. 4, the ejector pivots about the center axis of the pivot posts 56 to move the fingers 58 upward. Movement of the fingers 58 upward causes the module 10 to move upward thereby disconnecting or ejecting the module 10 from the electrical connector 12. In a preferred embodiment, the ejector fingers 58 are adapted to raise the module 10 at least a distance of about 0.120 inch. However, any suitable raising distance could be provided. One advantage of the present invention is the fact that the fingers 58, because the finger holes 54 extend, at least partially between adjacent contact holes 38 at an edge of the housing, are able to contact the bottom of the module chip 14 at an inward position such that there is a reduced possibility that the chip 14 could be damaged by the fingers 24. If the ejectors contacted the bottom of the chip 14 at a more outward position there would be an increased possibility that the chip 14 might break or be damaged at the outer edge of the chip or, that the ejectors could prematurely slip out from underneath the module 10 before the module was completely disconnected.

Figure 5:
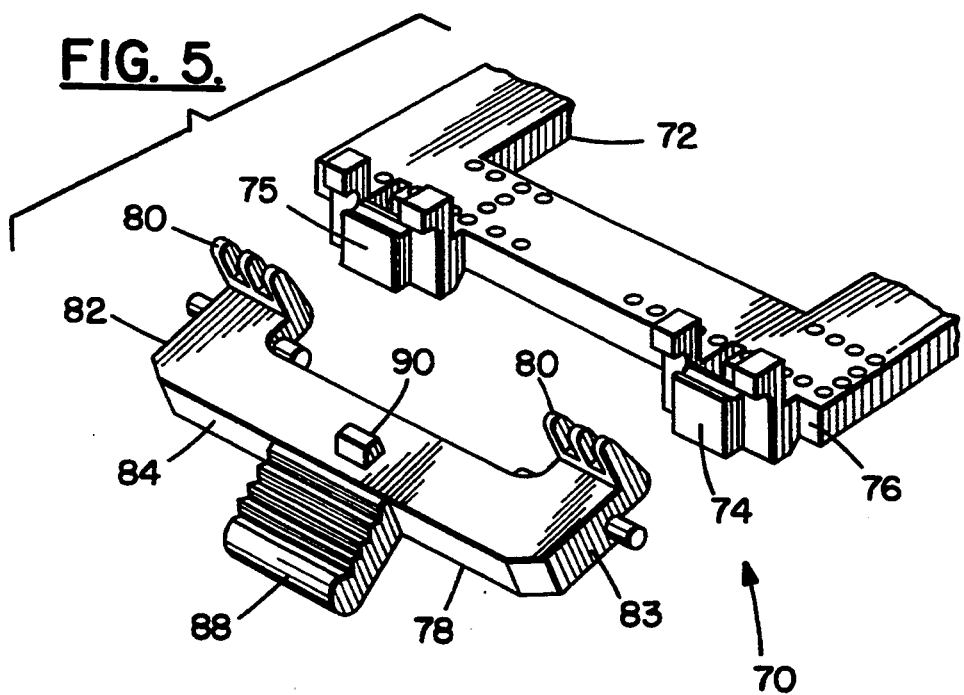
FIG. 5 is a exploded perspective view of one end of an alternate embodiment of an electrical connector incorporating features of the present invention.

Referring to FIG. 5, there is shown an alternate embodiment of the present invention. In the embodiment shown, the electrical connector 70 is substantially similar to the connector 12 of FIGS. 1–4. However, the connector 70 has a housing 72 with two spaced apart ejector receiving areas 74, 75 at the end 76 of the housing 72. The opposite end (not shown) also has two spaced apart ejector receiving areas and it's own ejector similar to ejector 78. Only half of the connector 70 is shown for clarity; it being understood that the half not shown is a mirror image of the half that is shown. The receiving areas 74, 75 are substantially similar to the receiving area 40 shown in FIG. 2. However, the six finger holes 54 shown in FIG. 2 are provided as two groups of three finger holes in the housing 72 of FIG. 5. Likewise, the six fingers 58 on the ejector 24 of FIG. 2 are provided as two groups of three fingers 80 on the ejector 78 in FIG. 5. Of course, in alternate embodiments, any suitable number or grouping of fingers and finger holes could be provided. In the embodiment shown in FIG. 5, the fingers 80 are provided at the ends of two spaced arms 82, 83. The arms 82, 83 are interconnected by an intermediate bridge section 84. Each of the arms 82, 83 have pivot posts 86 that are snap-lock connected in the receiving areas 74, 75. The bridge section 84 includes a thumb section 88 and a hold down lock 90. The bridge section 84 allows the user to move the fingers 80 at the same time when the thumb section is moved. This embodiment differs from the embodiment shown in FIGS. 1-4 due to the spaced apart nature of the two groups of fingers 80. This allows the fingers 80 to push against the bottom of an integrated circuit chip module in a more force distributed manner than that shown in the embodiment of FIGS. 1-4. This force distributed or distributed contact point embodiment further reduces the risk of damage to the chip. This also further insures full disconnection of the chip from the connector 70 by preventing canting or tilting of the chip as it is being ejected.

Referring now to FIGS. 6A-6D, an alternate embodiment of the present invention is shown. Once again, only one end of the electrical connector is shown, it being understood that the opposite end (not shown) is substantially a mirror image. The electrical connector 100 is substantially similar to the connector 70 shown in FIG. 5. However, in the embodiment shown in FIGS. 6A-6D, the connector 100 incorporates a different method of connecting the ejector 104 to the housing 102 and, a detent locating scheme for positively locating the ejector 104 at predetermined positions.

The housing 102 has six finger holes 106 and two spaced pivot sections 108 at the end 110 of the housing. The pivot sections 108 each have a pivot hole 112 with a center axis parallel to the edge of the end 110. In the embodiment shown, the holes 112 are generally circular, but include a flat section 114. The ejector 104 has two spaced apart arms 116, 117 and an intermediate bridging section 118. The arms 116, 117 each have three finger 120 and, a pivot post section 122. The pivot post sections each have two cantilevered sections 124, 125 with a slot 126 therebetween. The first section 124 has a curved exterior. The second section 125 has an exterior with two flat sections 128, 129. The two pivot post sections 122 extend in the same first direction as shown.

In order to assemble the ejector 104 to the housing 102, the pivot post sections 122 are aligned in front of the holes 112. The ejector 104 is then moved in the direction indicated by arrow C to position the pivot post sections 122 inside the holes 112. The ejector 104 is then rotated as indicated by arrow D in a direction orthogonal to direction C. As the ejector 104 is rotated, the fingers 120 move into finger holes 106 as clearly indicated in FIG. 6A. The interlocking nature of the fingers 120 in the finger holes 106 prevents the pivot post sections 122 from inadvertently sliding out of the pivot sections 108. This type of two step interlocking connection has an excellent advantage in ease of assembly.

Figure 6A:
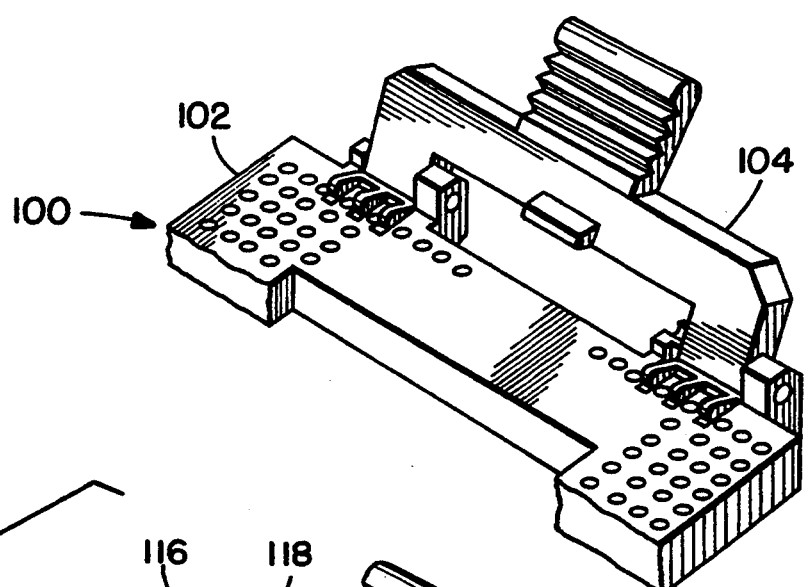
FIG. 6A is a partial perspective view of one end of an alternate embodiment of an electrical connector incorporating features of the present invention.
Figure 6B:
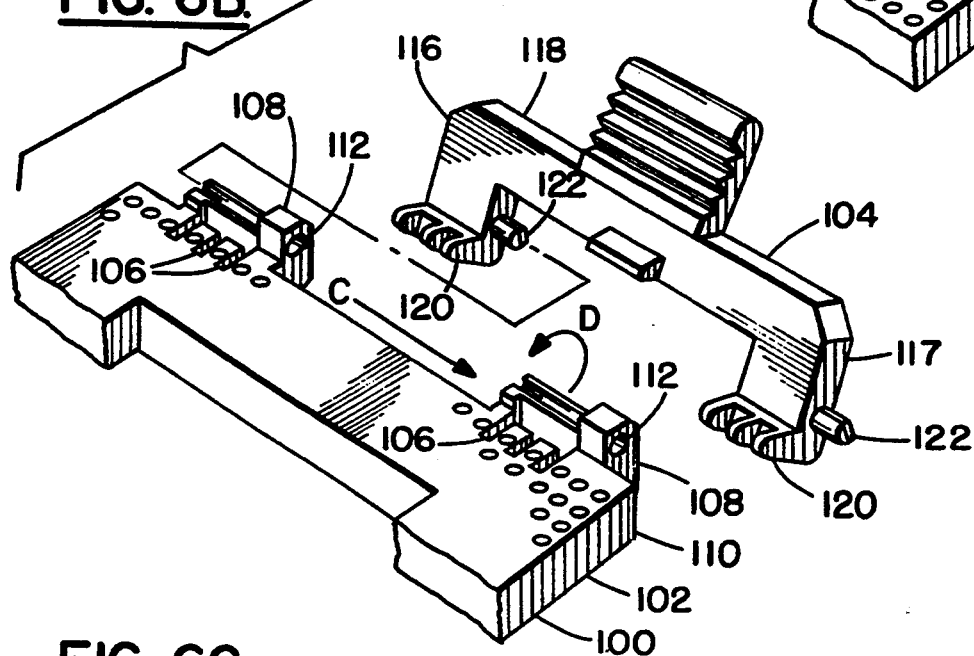
FIG. 6B is an exploded view of the connector end shown in FIG. 6A.
Figure 6C:
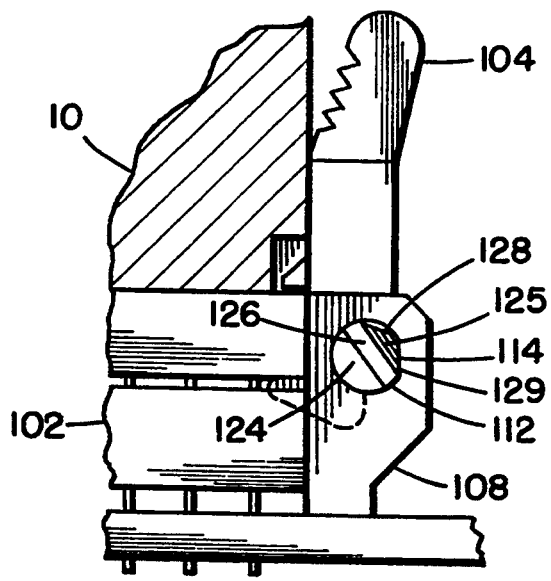
FIG. 6C is an enlarged schematic sectional view of the end of the connector shown in FIGS. 6A and 6B with a connected integrated circuit chip.
Figure 6D:
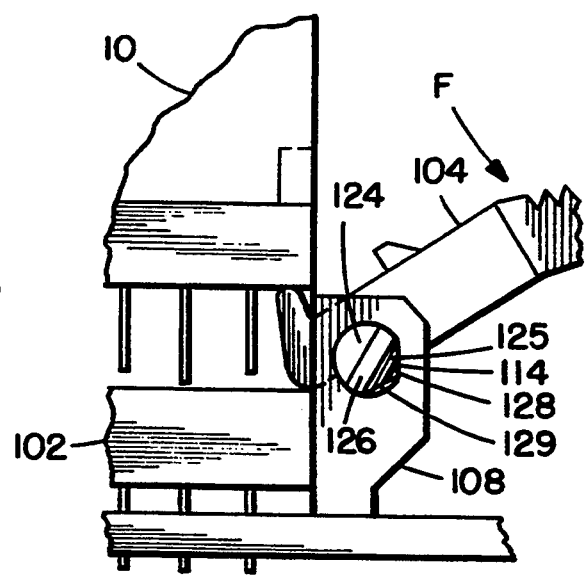
FIG. 6D is a schematic sectional view of the end of the connector shown in FIG. 6C with the ejector in an open ejection position.

After assembly, the ejector 104 has two basic positions on the housing 102; a first open position (shown in FIG. 6D), and a second closed or locking position (shown in FIG. 6C). In the open position (FIG. 6D), the first flat section 128 is in contact with the flat section 114 inside the hole 112. When the ejector 104 is moved to the closed position (FIG. 6C) the second cantilevered section 125 is deflected backwards in the slot 126 and then springs back when the second flat surface 129 comes into registry with the flat section 114. Because the second cantilevered section 125 must be deflected in order to move the ejector 104 between the open and closed positions, this configuration provides a positive detent for keeping the ejector 104 at either the open position or closed position until a user positively moves the ejector.

Figure 7A:
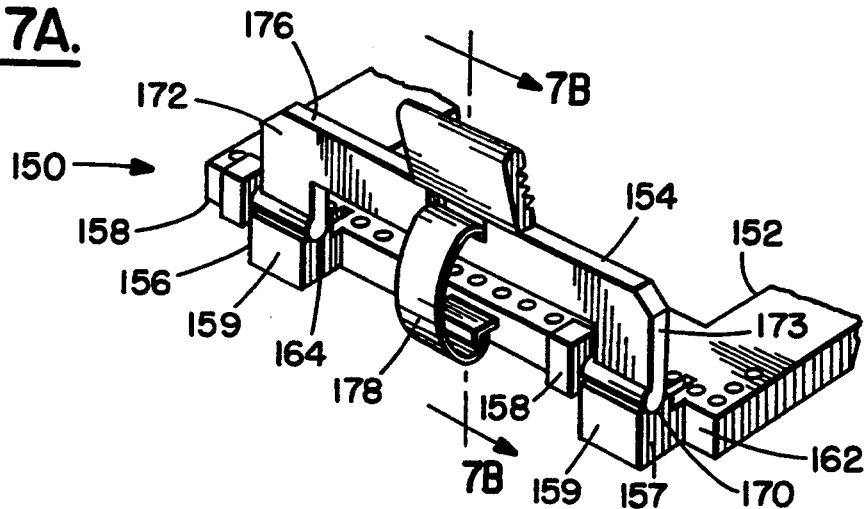
FIG. 7A is a perspective view of an end of an alternate embodiment of the present invention.
Figure 7B:
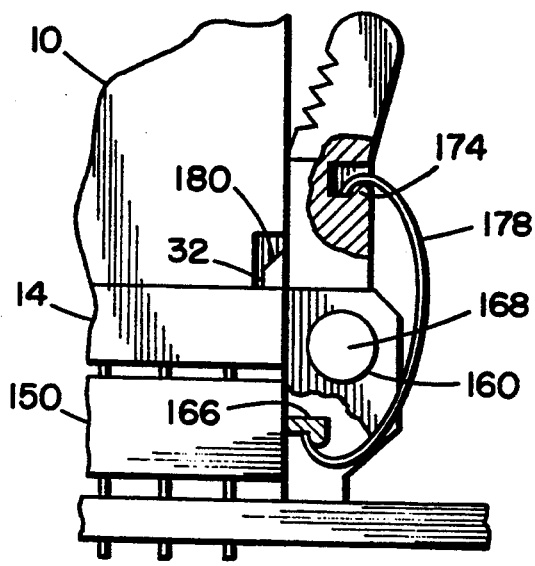
FIG. 7B is a schematic sectional view of the electrical connector taken along line 7B—7B shown in FIG. 7A with a integrated circuit chip connected thereto.
Figure 7C:
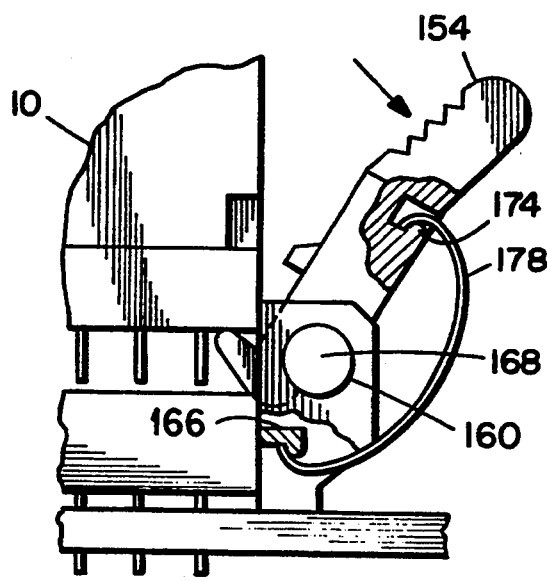
FIG. 7C is a schematic sectional view as in FIG. 7B showing the ejector moved to an ejection position.

Referring now to FIGS. 7A-7C there is shown an alternate embodiment of the present invention. In the embodiment shown, the electrical connector 150 is substantially similar to the connector 100 shown in FIGS. 6A-6D. However, in the embodiment shown in FIGS. 7A-7C, the connector 150 has a slightly different mounting of the ejector 154 to the housing 152 and, a different detent locator system for the ejector 154. The housing 152 has two spaced pivot post sections 156, 157. Each pivot post section 156, 157 has a first section 158 and a second section 159. The first sections 158 each include a pivot hole 160 with a circular cross-section. The pivot holes 160 have a common center axis parallel to the edge 162 of the end of the housing 152. The second sections 157 each include a pivot supporting surface 164. The housing 152 also includes a detent spring mount 166 between the two pivot post sections 156, 157.

The ejector 154 includes pivot posts 168 with circular cross-sections pivotally located in the holes 160, a pivot supporting surface 170 at the end of each arm 172, 173, and a detent spring mount 174 in the intermediate bridging section 176. The connector 150 further includes a detent spring 178. The detent spring 178 comprises a general C-shaped leaf spring with a first end connected to the housing 152 at the spring mount 166 and a second end connected to the ejector 154 at the spring mount 174. FIG. 7C shows the detent spring 178 in its normal shape. When the ejector 154 is moved from its open position shown in FIG. 7C to the closed position shown in FIG. 7B, the detent spring 178 must be expanded, at least through a portion of the rotation of the ejector. Thus, the detent spring 178 resists movement of the ejector 154 from the open position to the closed position unless positively moved by a user. In the embodiment shown, the detent spring 178 reaches its point of maximum deformation about half way through the rotation of the ejector from the open position to the closed portion. Therefore, as the ejector is moved from its halfway rotation position to the closed position, the detent spring acts positively on the ejector to move it towards the closed portion. When the ejector 154 reaches its closed position the detent spring 178 helps to bias the hold down lock 180 against the top surface 32 of the module chip 14. This helps to prevent movement of the module 10 while connected to the connector 150.

Figure 8A:
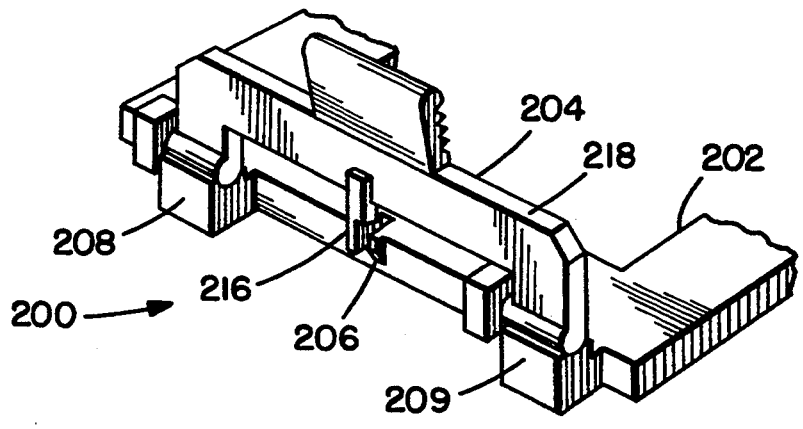
FIG. 8A is a perspective of an end of an alternate embodiment of an electrical connector incorporating features of the present invention.

Referring now to FIGS. 8A–8C, there is shown an alternate embodiment of the present invention. In the embodiment shown, the connector 200 is substantially similar to the connector 150 shown in FIGS. 7A–7C. However, in the embodiment shown in FIGS. 8A–8C the connector 200 has a different type of ejector detent locator. The housing 202 has a locking section 206 located between the pivot post sections 208,209. The locking section 206, seen best in FIG. 8B, has a first ledge 210, a second ledge 212, and a tapered lead-in 214. The ejector 204 includes a detent post 216 extending from the bottom of the intermediate bridging section 218. The detent post 216 as best seen in FIG. 8C, has a ramp surface 220, and a snap-lock surface 222. When the ejector 204 is connected to the housing 202, the end 224 of the post 216 is able to pass through the tapered lead-in 214 and snap-locks behind the first ledge 210 with the surface 222 contacting the ledge 210. This establishes a rear most open position for the ejector 204. When the ejector 204 is moved from its open position to its closed portion, the surface 222 moves away from the first ledge 210 and snap-locks over the second ledge 212 thereby locking the ejector 204 in the closed potion. This type of snap-lock detent location of the ejectors securely prevent the ejectors from inadvertently opening once they are closed.

Referring to FIGS. 9A–9B, there is shown an alternate embodiment of the present invention. In the embodiment shown, the housing 252 has a locking section 256 with three longitudinal slots 258, 259, 260 located along a curved section 262. The ejector 254 has a detent post 264 extending from the bottom of the bridging section 266. A bottom surface 268 of the post 264 is slightly tapered. The post 264 has a general elongate shape. When the ejector 254 has its pivot posts 270, 271 inserted into the pivot holes 272 of the housing 252, the post 264 slides into the first slot 258. The slightly tapered bottom surface 268 assists in ease of insertion of the post 264 into the first slot 258. Alternatively, the slot 258 could be tapered rather than bottom surface 268. The ejector 254 is then rotated upward such that the post 264 is deflected and moved out of the first slot 258 and rides along the curved surface 262 towards the second slot 259. The ejector 254 can be moved by a user between open and closed positions with the detent post 264 moving between the second and third slots 259, 260, respectively.

Referring to FIG. 10, there is shown a top view of the interior of a housing 302 showing a center aperture 304 and contact holes 306. In the prior art, it is common to provide the housing with a keying contact hole, such as hole 306A, on an interior projection, such as projection 308A, at a single corner of the center aperture. A user attempting to connect the module to the prior art connector would visually ascertain where the keying pin on the module was and align the keying pin over the keying hole prior to connection. If the keying pin was not aligned over the keying hole, rather it being at one of the other three corners, the module could still be connected to the prior art connector with the keying pin merely being located or ending up in the center aperture. The error in misconnection would not be uncovered until a user attempted to use the module. The housing 302 is designed to prevent this type of misconnection by blocking the keying pin unless the keying pin is positioned over the keying hole 306A. To accomplish this, the housing 302 is provided with three additional projections, 308B, 308C, and 308D. Each one of the additional projections 308B–308D is located at a separate corner of the center aperture 304. Therefore, if a module or chip with an interior keying pin is attempted to be connected to the connector 300, the keying pin must be located over keying hole 306A otherwise the keying pin would hit and be blocked by the projections 308B–308D at the other three corners. The housing 302 could be sold with or without ejectors. Ejectors could be sold separately from the housing and added by a user if desired.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An electrical connector comprising:
   a housing;
   electrical contacts mounted to the housing; and
   an ejector pivotably mounted to the housing, the ejector having a first section that is laterally slid along a side of the housing in a first direction into a first receiving portion of the housing and a second section that is then rotated in a second direction, orthogonal to the first direction, into a second receiving portion of the housing such that interaction between the second section and the housing prevents the ejector from inadvertently laterally sliding out of the first receiving portion in a third direction opposite to the first direction.

2. A connector as in claim 1 wherein the ejector has a hold down lock adapted to be positioned over a portion of an integrated circuit chip.

3. A connector as in claim 1 wherein the ejector includes a locating detent for positively locating the ejector at a first open position and a second locking position.

4. A connector as in claim 1 wherein the ejector has two spaced arms, each arm having the first and second sections and the housing has at least two of the first and second receiving portions.

5. A connector as in claim 4 wherein the first sections each include a pivot post section extending from the arms in the first direction.

6. A connector as in claim 1 wherein the second section includes spaced fingers and the second receiving portion of the housing includes spaced finger holes extending into the housing from a top surface of the housing.

7. A claim as in claim 6 wherein the finger holes extend, at least partially, between adjacent contact receiving areas in the housing.

8. An electrical connector comprising:
   a housing having a top surface, contact receiving holes extending from the top surface through the housing, and ejector receiving areas located on opposite sides of the housing, the ejector receiving areas including spaced finger holes extending into the housing along edges of the top surface, the finger holes extending, at least partially, between some of the adjacent contact receiving holes;
   electrical contacts mounted in the contact holes; and
   ejectors mounted to the housing at the ejector receiving areas, the ejectors having fingers movably located in the finger holes between recessed positions and extended positions.

9. A connector as in claim 8 wherein the ejectors each include a hold down lock adapted to be positioned over a portion of an integrated circuit chip.

10. A connector as in claim 8 wherein the fingers have a top surface that is moved about 0.08 inch when the fingers are moved from their recessed positions to their extended positions.

11. A connector as in claim 8 further comprising means for detent locating the ejectors at an open position and a locking position relative to the housing.

12. A connector as in claim 8 wherein the ejectors each comprise two spaced arms, each arm having the fingers thereon.

13. A connector as in claim 12 wherein the arms include pivot post sections extending in a first direction from each of the arms.

14. An electrical connector comprising:
a housing;
electrical contacts connected to the housing;
ejectors pivotably connected to the housing, the ejectors each having two arms pivotably connected to the housing and an intermediate bridging section connecting the two arms to each other; and
means for detent locating the ejectors at a first open position and a second locking position wherein the ejectors are retained at the first position and second position until moved by a user and, the means for detent locating includes C-shaped leaf springs, each spring having an end connected to one of the ejectors and an opposite end connected to the housing.

15. A connector as in claim 14 wherein the ejectors include pivot post sections extending from the arms in a first direction.

16. A connector as in claim 15 wherein the pivot post sections each include a spring arm section with two flat surfaces.

17. A connector as in claim 16 wherein the housing has pivot holes with an interior flat surface, the first position and second position being obtained when the two flat surfaces of the pivot post section come into registry with the interior flat surface of the pivot holes.

18. A connector as in claim 14 wherein the means for detent locating the ejectors includes each ejector having a detent post extending from the intermediate bridging section.

19. A connector as in claim 18 wherein the detent posts each have a snap lock ledge and the housing has locking sections such that the ejectors are snap locked in the second locking position when moved thereto.

20. A connector as in claim 18 wherein the detent posts each have an elongate length along a bottom of the bridging section.

21. A connector as in claim 20 wherein the detent posts each have tapered bottom edges.

22. An electrical connector adapted to removably connect an integrated circuit chip to a printed circuit board, the chip having male contact pins arranged in a general ring shape about a bottom perimeter of the chip with a keying pin in one interior corner of the ring shape, the electrical connector comprising:
a housing having a top surface with a center aperture extending through the housing from the top surface to a bottom surface, the housing including four projections extending into the center aperture from four corners of the center
aperture and, contact receiving areas; electrical contacts mounted to the housing in the contact receiving areas; and
means for preventing connection of the chip to the electrical contacts unless the chip is located at a predetermined orientation relative to the housing, the means for preventing connection comprising only a first one of the four projections having a contact receiving area and the four projections being suitably positioned such that the projections will block the keying pin, thereby blocking insertion of the chip, unless the keying pin is aligned over the first projection.

23. A method of connecting ejectors to a housing of an integrated circuit chip socket connector, the method comprising steps of:
providing a housing of the socket connector with pivot sections at edges of the housing, the pivot sections each having a pivot hole with a center axis parallel to its associated edge;
providing an ejector with two spaced arms, each arm having a pivot post extending in a first direction;
inserting the pivot posts into two of the pivot holes in the first direction along one of the edges of the housing, the pivot posts axially sliding into the two pivot holes; and
rotating the ejector in a second direction orthogonal to the first direction such that a portion of the ejector is rotated into a receiving cavity of the housing to block removal of the pivot posts from the pivot sections in a third direction reverse to the first direction.

24. An electrical connector comprising:
a housing;
electrical contacts connected to the housing;
ejectors pivotably connected to the housing, the ejectors each having two arms pivotably connected to the housing and an intermediate bridging section connecting the two arms to each other; and
means for detent locating the ejectors at a first open position and a second locking position wherein the ejectors are retained at the first position and second position until moved by a user, the means for detent locating the ejectors includes each ejector having a detent post and, the detent posts each have a snap lock ledge and the housing has locking sections such that the ejectors are snap locked in the second locking position when moved thereto.

* * * * *